United States Patent [19]
Tarui et al.

[11] Patent Number: 5,120,667
[45] Date of Patent: Jun. 9, 1992

[54] PROCESS FOR FABRICATING A THIN FILM TRANSISTOR

[75] Inventors: Keiji Tarui, Nara; Tatsuo Morita, Kyoto; Shuhei Tsuchimoto, Nara, all of Japan

[73] Assignee: Sharp Kabushiki Kaisha, Osaka, Japan

[21] Appl. No.: 778,750

[22] Filed: Oct. 18, 1991

Related U.S. Application Data

[63] Continuation of Ser. No. 700,796, May 15, 1991, abandoned.

[30] Foreign Application Priority Data

May 17, 1990 [JP] Japan .................. 2-129973

[51] Int. Cl.⁵ .................................. H01L 21/70
[52] U.S. Cl. .......................... 437/40; 437/21; 437/41; 437/62; 437/83; 437/228; 357/23.7
[58] Field of Search ............... 437/21, 29, 40, 41, 437/63, 83, 84, 228, 233, 235; 357/23.7

[56] References Cited

U.S. PATENT DOCUMENTS

| | | | |
|---|---|---|---|
| 4,282,543 | 8/1981 | Ihara et al. ................ | 357/23.7 |
| 4,788,157 | 11/1988 | Nakamura .................. | 437/84 |
| 4,943,837 | 7/1990 | Komishi et al. ........... | 437/21 |
| 4,980,308 | 12/1990 | Hayashi et al. ........... | 437/83 |
| 5,023,197 | 6/1991 | Haond et al. .............. | 437/40 |

FOREIGN PATENT DOCUMENTS

| | | |
|---|---|---|
| 58-102560 | of 0000 | Japan . |
| 0116627 | 9/1981 | Japan . |
| 0220820 | 9/1989 | Japan . |

Primary Examiner—Tom Thomas
Attorney, Agent, or Firm—Nixon & Vanderhye

[57] ABSTRACT

A TFTs fabricating process practicable at a low temperature, which includes the steps of forming a multi-layer body on a substrate, the multi-layer body including a semiconductor layer, a gate insulating layer and a lower thin layer, patterning the multi-layer body into islands, thereby removing the other portions of the multi-layer body, forming an insulating layer on the sides of the island-patterned multi-layered portion by etching at a selective ratio between the constituents of the insulating layer and the lower thin layer, forming an upper thin layer, and etching the upper and lower thin layers into upper and lower gate electrodes by use of one resist pattern.

14 Claims, 6 Drawing Sheets

PROCESS FOR FABRICATING A THIN FILM TRANSISTOR

This is a continuation of application Ser. No. 07/700,796, filed May 15, 1991, now abandoned.

BACKGROUND OF THE INVENTION

1. Field of the Invention

The present invention relates to a process for fabricating thin film transistors, and more particularly to a process for fabricating thin film transistors (hereinafter called "TFT") at a low temperature, the TFTs being adapted for use in display devices and image sensors.

2. Description of the Prior Art

TFTs used for driving liquid crystal display devices and image sensors are fabricated in the same manner as the IC fabricating process. The ICs must be processed at about 1,000° C. so as to effect crystallization, formation of insulating layers and activation of impurities, which requires that the substrate on which IDs are formed must be selected from materials which can withstand high temperatures. The commonest material is quartz. Such a requirement makes it difficult to use a large substrate on which ICs are formed. In order to solve the problems arising at high temperatures, amorphous or polycrystalline substance is used as a starting material which is crystallized by the solid phase growth or by laser annealing.

A TFT is a MOS type transistor. The performances of transistors depend upon the interface condition of the gate insulating layer and the semiconductor layer. When transistors are processed at low temperatures, the gate insulating layers are also processed at equally low temperatures.

Thin semiconductor layers are formed in a desired shape on a substrate, and subjected to surface treatment with the use of hydrofluoric acid, etc. Then, gate insulating layers are formed by sputtering or by a CVD method. These methods are not appropriate for reducing the interfacial level density for an unkown reason. The reason has been investigated. The investigation teaches that thin semiconductor layers should be followed by the formation of gate insulating layers without pause before the thin semiconductor layers are exposed to atmosphere.

In order to improve the performance of TFTs formed at low temperatures, it is necessary to reduce the interfacial level density between the semiconductor and gate insulating layers. In order to achieve this, the formation of thin semiconductor layers must be followed by the overlaying of gate insulating layers. To make the overlying layers as a TFT, the layer to be overlaid is formed in a desired island-shaped pattern in which the sides of the semiconductor layer are exposed outside. If the gate electrode is formed under this condition, the exposed sides of the semiconductor layer and the gate electrode are likely to come into contact with each other, thereby increasing the current leak. In order to prevent this current leak, it is required to cover the exposed sides of the semiconductor layer with an insulating layer 8 as shown in FIG. 9, prior to the formation of the gate electrode. In FIG. 9, an insulating substrate 1 on which a semiconductor layer 2, a gate insulating layer 3, and a gate electrode 4 overlap one above another. If the insulating layer 8 is made of $SiO_2$, which is a material in common use for making gate insulating layers, the $SiO_2$ of the gate insulating layer 3 is simultaneously etched. This simultaneous etching leaves the insulating layer 8 from shaping, and even if $SiO_2$ and $SiO_2$ have a large etching selective ratio, the simultaneous fabrication by etching is difficult. A PSG is known in the art which is fabricated by doping the $SiO_2$ of an insulating layer with phosphorus. The larger the amount of the added phosphorus is, the larger the selective ratio becomes, but the phosphorus diffuses from the sides of the semiconductor layer 2, thereby changing the characteristics of the thin film transistor (TFT).

SUMMARY OF THE INVENTION

The thin film transistors fabricating process of the present invention, which overcomes the above-discussed and numerous other disadvantages of the prior art, comprises the steps of forming a multi-layer body on a substrate, the multi-layer body including a semiconductor layer, a gate insulating layer and a lower thin layer, patterning the multi-layer body into islands, thereby removing the other portions of the multi-layer body, forming an insulating layer on the sides of the island-patterned multi-layered portion by etching at a selective ratio between the constituents of the insulating layer and the lower thin layer, forming an upper thin layer, and etching the upper and lower thin layers into upper and lower gate electrodes by use of one resist pattern.

In a preferred embodiment, the formation of the multi-layer body is conducted in a vacuum or inert-gas filled space, thereby preventing the multi-layer body from being exposed to the atmosphere.

In a preferred embodiment, the multi-layered portion is etched with a reactive ion-etchant so as to make the sides of the islands perpendicular to the substrate.

In a preferred embodiment, the insulating layer on the sides of the islands is made of $Si_3N_4$.

In a preferred embodiment, the gate electrode layer is made of metal.

Alternatively, the process comprises the steps of preparing a substrate having a first insulating layer on a surface, forming a multi-layer body on the insulating layer of the substrate, the multi-layer body including a semiconductor layer, a gate insulating layer and a lower thin layer, patterning the multi-layer body into island, thereby removing the other portions of the multi-layer body than the island, forming a second insulating layer on the sides of the island, forming an upper thin layer, and etching the upper and lower thin layers into gate electrodes by use of the same resist pattern.

In a preferred embodiment, the first and the second insulating layers of the substrate are made of different materials. In a preferred embodiment, the second insulating layer on both sides of the island is formed by overlaying it on the whole surface of the substrate, and removing other than a portion on both sides of the island by anisotropic etching.

In a preferred embodiment, the anisotropic etching is a plasma etching, and wherein the spectroscopic characteristics of the plasma applied to the second insulating layer is detected throughout the etching process so as to detect a change in the spectroscopic characteristics occurring when the first insulating layer is exposed, thereby controlling the period of time over which the plasma etching is applied to the second insulating layer.

Thus, the invention described herein makes possible the objective of providing a TFT fabricating process which can form TFTs over a relatively wide range of a substrate easily with a high yield of manufacture.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 2A:
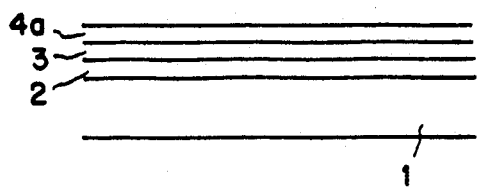
FIGS. 2A to 8B are diagrammatic sectional views showing the steps of fabricating a thin film transistor.
Figure 2B:
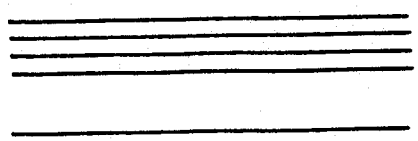

Referring to FIGS. 1 to 8, a first example of the present invention will be described:

As shown in FIGS. 2(a) and 2(b), a glass substrate 1, after it is cleansed, is placed on a plasma CVD apparatus. The substrate 1 is heated to a temperature ranging from 400° C. to 600° C., and a SiH$_4$ gas is decomposed by heat and plasma, and deposited on the glass substrate 1 so as to form an amorphous Si layer to a thickness of about 1000 angstroms. The deposited amorphous Si layer is annealed in a vacuum or in an inert gas atmosphere at 600° C. for about 50 hours so as to form a polycrystalline silicon layer 2. Then, a SiO$_2$ layer is formed to a thickness of about 1000 angstroms by sputtering so as to make it into a gate insulating layer 3. In the course of conducting the steps described above, the glass substrate 1 is transported from the plasma CVD apparatus to the sputtering furnace by way of the annealing furnace in a confined chamber kept in a vacuum or filled with an inert gas, thereby ensuring that the substrate is kept free from exposure to the atmosphere.

Then, a polycrystalline silicon layer is formed to a thickness of about 1000 angstroms by a vacuum CVD apparatus, so as to make a lower gate electrode 4a. The resulting three-layered structure is shown in FIGS. 2(a) and 2(b).

Figure 3A:
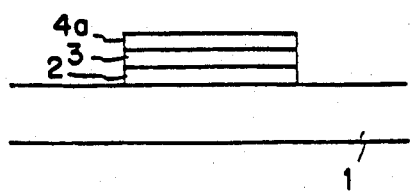
Figure 3B:
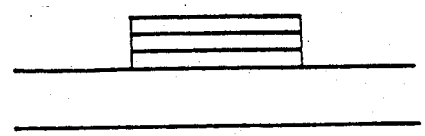

The next step is shown in FIGS. 3(a) and 3(b), by which the three-layered layer is etched into an island-shaped pattern by use of a resist pattern produced in the transistor portion. The etching is a reactive ion-etching, which is called an anisotropic etching in which the sides of the island-patterned multi-layer portion are vertical to the surface of the substrate surface. The etchant can be a gaseous mixture of SF$_6$ and CCl$_4$ for a polycrystalline silicon layer, and a CHF$_3$ gas for a SiO$_2$ layer.

Figure 4A:
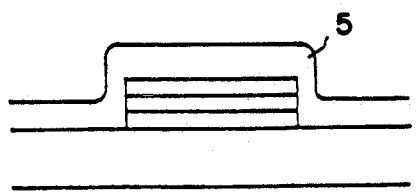
Figure 4B:
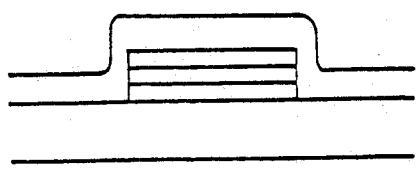
Figure 5A:
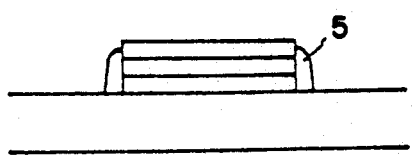
Figure 5B:
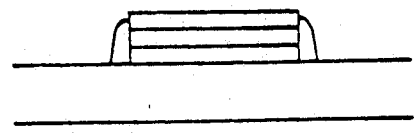

The steps advance to that shown in FIGS. 4(a) and 4(b), in which the whole surface of the substrate 1 is covered with a SiO$_2$ layer 5 formed to a thickness of about 5000 angstroms by sputtering or a normal-pressure CVD method. Then, an anisotropic etching is carried out with a reactive ion etchant so that the SiO$_2$ remains only on the sides of the island-patterned multi-layer portion as shown in FIGS. 5(a) and 5(b).

Figure 1:
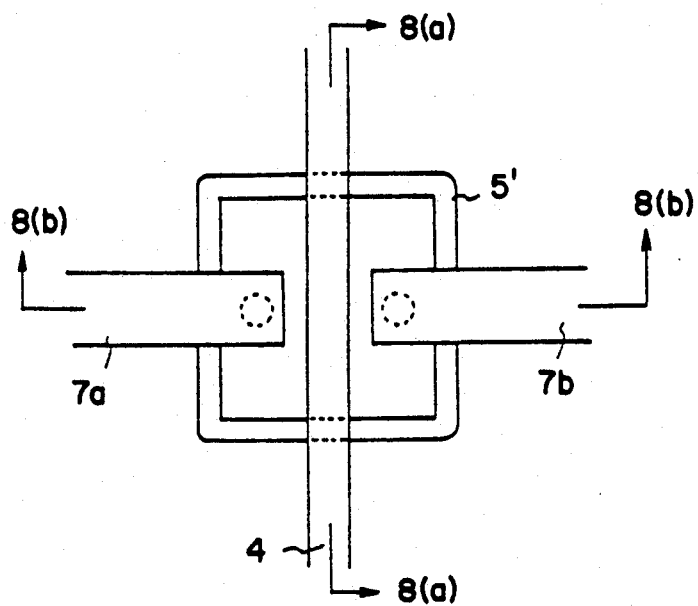
FIG. 1 is a plan view showing a thin film transistor to be fabricated by the present invention.
Figure 9:
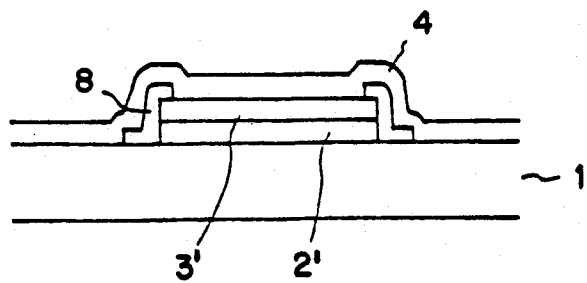
FIG. 9 is a sectional view showing a known thin film transistor.
Figure 6A:
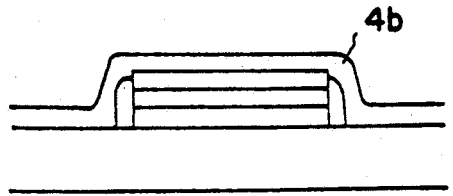
Figure 6B:
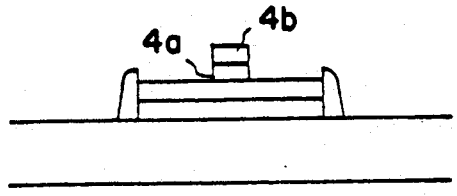

Then, as shown in FIG. 6(a), a polycrystalline silicon layer is deposited by a vacuum CVD method to a thickness of about 2000 angstroms as an upper gate electrode 4b, and then the upper gate electrode 4b and a lower gate electrode 4a are formed by a reactive ion etchant through a resist pattern formed as a gate electrode. The finished gate electrode 4 is shown in FIG. 1. Then, any suitable impurities are ion injected on the substrate 1, and an activating annealing is carried out. In this way the upper gate electrode 4a, the lower gate electrode 4b and the polycrystalline silicon layer, which is later made into a source and a drain at opposite sides of the gate electrode, are made so as to have a low resistance with electrically conductivity.

Figure 7A:
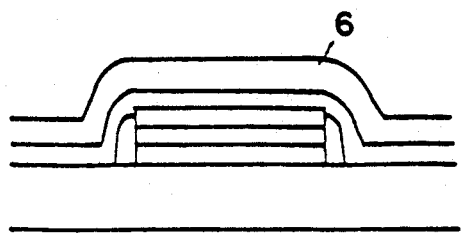
Figure 7B:
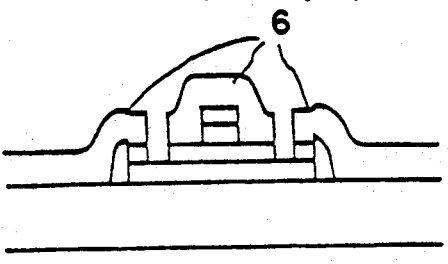

The next step is the stage shown in FIGS. 7(a) and 7(b) in which an insulating layer 6 is formed. More specifically, a SiO$_2$ or a PSG layer having a phosphorus doping is formed on the whole surface of the substrate 1 by a normal pressure CVD method, and contact holes (not numbered) are formed in the layer 6 at the junction of electrodes. Other contact holes are formed in the layer 6 on a gate electrode 4 connected to an Al wiring, which is described in the next paragraph.

Figure 8A:
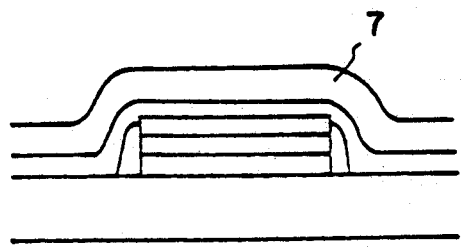
Figure 8B:
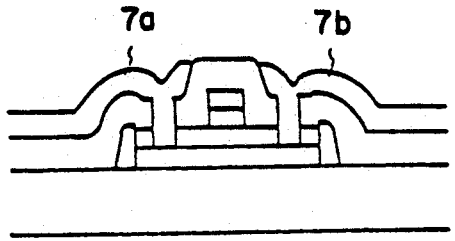

An Al layer 7 having a thickness of about 5000 angstroms is first formed by sputtering, and then it is made into Al layer wirings 7a and 7b of a predetermined shape by photo-etching as shown in FIGS. 8(a) and 8(b). In this way, the final TFT having a desired wiring as shown in FIG. 1 is obtained.

As is evident from the foregoing description, the insulating layer on the sides of the island, that is, the island-patterned multi-layer portion, and the gate electrodes are made of different materials, thereby avoiding the difficulty resulting from the use of the same kind of material which is adopted under the known fabricating process.

The insulating layer on the sides of the island-patterned multi-layer portion can be made of Si$_3$N$_4$ or other material if they do not unfavorably affect the semiconductor. The gate electrode can be made of metal such as Ti or W, instead of polycrystalline silicon, or made of a combination of them with silicide.

Referring to FIGS. 10 to 18, a second example will be described:

A SiN film 22 is formed on the substrate 1 to a thickness of about 3000 angstroms by a plasma CVD apparatus after the substrate 1 is cleansed. Then an amorphous Si layer is formed on the first Si layer at a temperature of 400° C. to 600° C. by using a SiH$_4$ diluted with H$_2$ and decomposed by heat and plasma. This layer is about 1000 angstroms thick. The Si layer is annealed at 600° C. at a vacuum or in an inert gas atmosphere for about 50 hours so as to make it into polycrystalline Si layer 23. A SiO$_2$ is then formed by sputtering to a thickness of about 1000 angstroms from which a gate insulating layer is formed at a later stage. These processes are conducted without being exposed to atmosphere as described above.

Figure 11A:
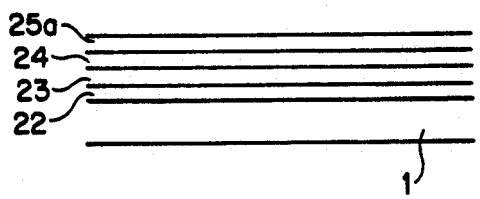
FIGS. 11A to 17B are diagrammatic sectional views showing the steps of performing the second example.
Figure 11B:
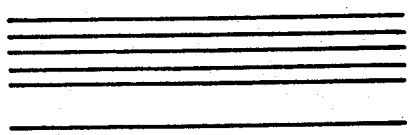
Figure 12A:
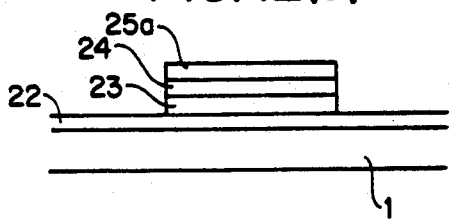
Figure 12B:
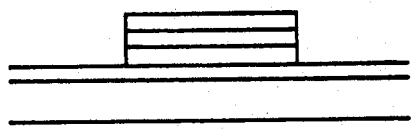

FIG. 11 shows the formation of a polycrystalline silicon layer having a thickness of about 1000 angstroms from which a first gate electrode 25a is formed. In this way three layers 22, 23, and 25a are obtained, all of which are patterned by use of the same resist pattern into an island-shaped portion, hereinafter referred to the island as shown in FIG. 12. A reactive ion etchant is used and an anisotropic etching is adopted so that after etching each vertical section is perpendicular to the substrate 1. As an etching gas, a gaseous mixture of SF$_6$ and CCl$_4$ is used for the polycrystalline silicon layer and a CHF$_3$ gas is used for the SiO$_2$.

Figure 18:
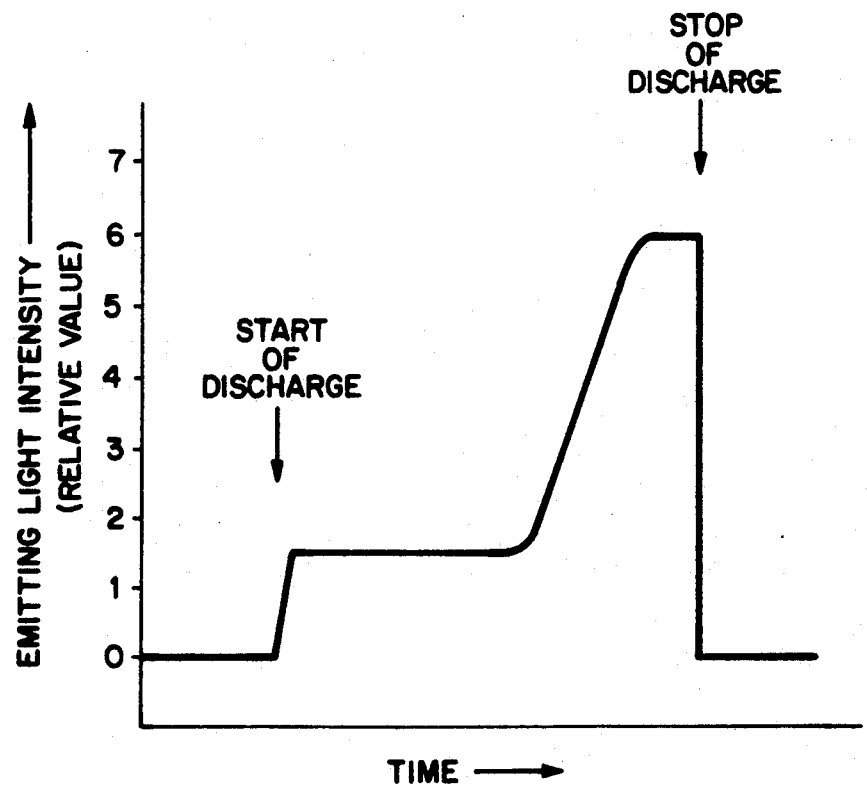
FIG. 18 is a graph showing the intensities of an emitting light varying with time.
Figure 13A:
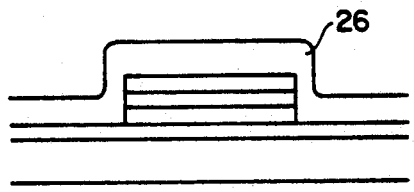
Figure 13B:
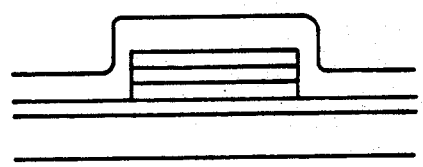
Figure 14A:
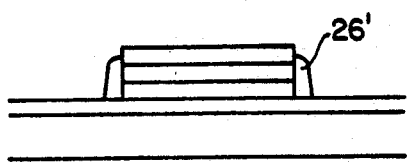
Figure 14B:
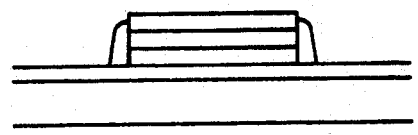

Then, as shown in FIG. 13, the whole surface of the substrate 1 is covered with a $SiO_2$ 26 having a thickness of about 5000 angstroms by a sputtering device or a normal pressure CVD device. Afterward, a reactive ion etchant is used to perform an anisotropic etching so as to remove the $SiO_2$ 26 until the only sides of the island remain as shown in FIG. 14. FIG. 18 shows the variations with time in the emitting light intensity from the initiation of the etching, of the spectrums of 388 nm of CN resulting from the etching gas $CHF_3$ and the SiN layer 22 selected from the plasma emitting spectrums. When a critical level is ascertained where the emitting light intensity does not increase any longer, the etching process is stopped. This ensures that a constant size of the $SiO_2$ layer is formed on the sides of the island.

Figure 15A:
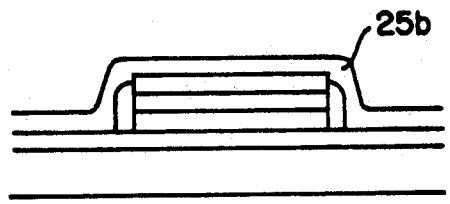
Figure 15B:
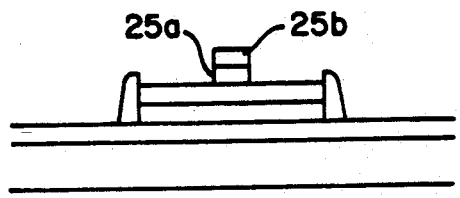
Figure 16A:
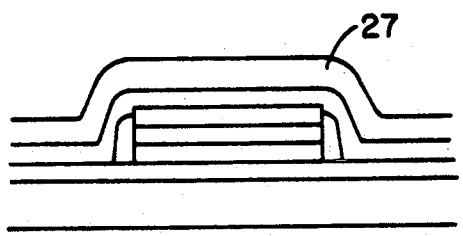
Figure 16B:
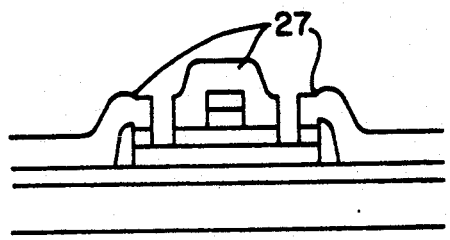

The next step is to form a polycrystalline silicon layer having a thickness of about 2000 angstroms by a reduced pressure CVD device from which a second gate electrode 25b is made. As shown in FIG. 15, a resist pattern is formed so as to shape the gate electrode as desired. With the use of the pattern, the first gate electrode 25a and the second gate electrode 25b are etched with a reactive ion etchant at the same time.

Then, ion is injected into the gate electrodes 25a and 25b so as to effect an activated annealing, so that the polycrystalline silicon layer of the two gate electrodes and a polycrystalline silicon layer from which a drain is later formed are treated so as to have low resistance.

Then, a PSG layer is formed by doping the substrate 1 with $SiO_2$ or phosphorus, and contact holes are made at desired spots so as to form an inter-layer insulating layer 7. The gate insulating layer is also provided with holes so that the source and drain and an Al electrode referred to below may be electrically connected. The contact hole is made in a layer 27 on the gate electrode 25 connected to an Al wiring referred to below (not shown).

Figure 10:
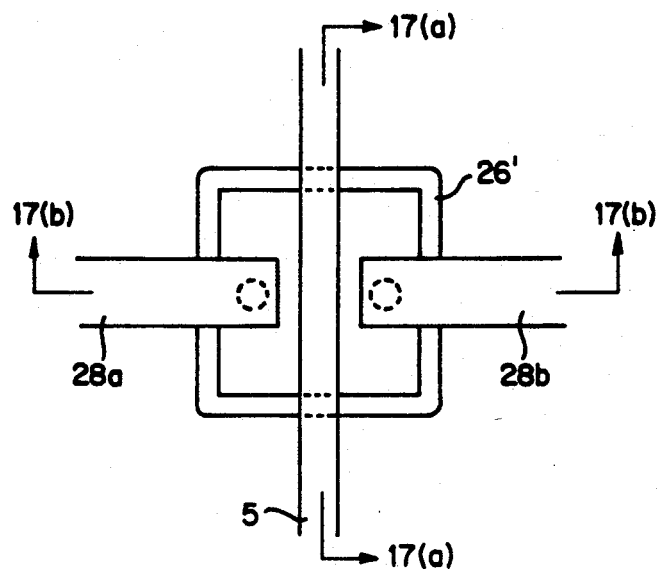
FIG. 10 is a plan view showing a thin film transistor according to a second example of the present invention.
Figure 17A:
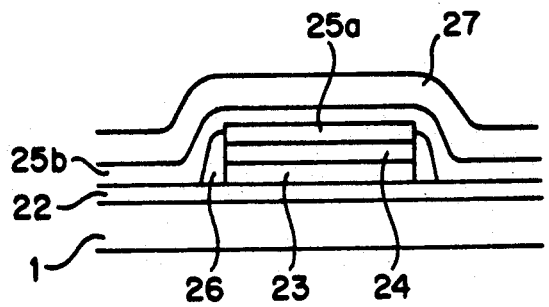
Figure 17B:
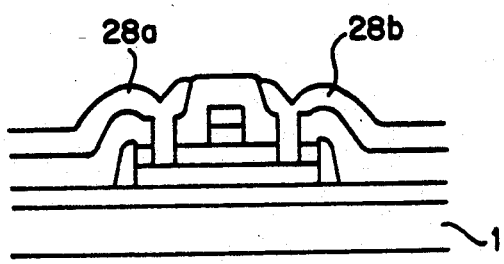

The next step is to form an Al layer to a thickness of about 5000 angstroms by sputtering to a desired shape for a source electrode 28a and a drain electrode 28b, which, as a thin film transistor and a circumferential wirings, is shown in FIG. 17. The final TFT is shown in FIG. 10.

The material for the first insulating layer on the substrate 1 and the material for the second insulating layer on the sides of the island are replaceable, and any other materials can be used for the insulating layers on condition that they have different spectroscopic characteristics. As described with respect to the first example, the gate electrode can be made of metals such as Ti or W instead of the polycrystalline silicon.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A process for fabricating a thin film transistor, the process comprising the steps of forming a multi-layer body on a substrate, the multi-layer body including a semiconductor layer, a gate insulating layer and a lower thin layer, patterning the multi-layer body into islands, thereby removing the other portions of the multi-layer body, forming an insulating layer on the sides of the island-patterned multi-layered portion by etching at a selective ratio between the constituents of the insulating layer and the lower thin layer, forming an upper thin layer, and etching the upper and lower thin layers into upper and lower gate electrodes by use of the same resist pattern.

2. A process as defined in claim 1, wherein the formation of the multi-layer body is conducted in a vacuum or inert-gas filled space, thereby preventing the multi-layer body from being exposed to the atmosphere.

3. A process as defined in claim 1, wherein the multi-layered portion is etched with a reactive ion-etchant so as to make the sides of the island perpendicular to the substrate.

4. A process as defined in claim 1, wherein the insulating layer on the sides of the island is made of $Si_3N_4$.

5. A process as defined in claim 1, wherein the gate electrode layer is made of metal.

6. A process as defined in claim 1, wherein the insulating layer on the sides of the island is made of $SiO_2$.

7. A process as defined in claim 1, wherein the gate electrode layer is made of poly-crystalline silicon.

8. A process for fabricating a thin film transistor, the process comprising the steps of preparing a substrate having a first insulating layer on a surface, forming a multi-layer body on the insulating layer of the substrate, the multi-layer body including a semiconductor layer, a gate insulating layer and a lower thin layer, patterning the multi-layer body into islands, thereby removing the other portions of the multi-layer body than the island, forming a second insulating layer on the sides of the island, forming an upper thin layer, and etching the upper and lower thin layers into gate electrodes by use of the same resist pattern.

9. A process as defined in claim 8, wherein the formation of the multi-layer body is conducted in a vacuum or inert-gas filled space, thereby preventing the multi-layer body from being exposed to the atmosphere.

10. A process as defined in claim 8, wherein the first and the second insulating layers of the substrate are made of different materials.

11. A process as defined in claim 8, wherein the second insulating layer on both sides of the island is formed by overlaying it on the whole surface of the substrate, and removing other than a portion on both sides of the island by anisotropic etching.

12. A process as defined in claim 11, wherein the anisotropic etching is a plasma etching, and wherein the spectroscopic characteristics of the plasma applied to the second insulating layer is detected throughout the etching process so as to detect a change in the spectroscopic characteristics occurring when the first insulating layer is exposed, thereby controlling the period of time over which the plasma etching is applied to the second insulating layer.

13. A process as defined in claim 8, wherein the insulating layer on the sides of the island is made of $Si_3N_4$.

14. A process as defined in claim 8, wherein the insulating layer on the sides of the island is made of $SiO_2$.

* * * * *